(12) United States Patent
Wang et al.

(10) Patent No.: US 12,191,263 B2
(45) Date of Patent: Jan. 7, 2025

(54) SEMICONDUCTOR STRUCTURE AND MANUFACTURING METHOD OF SEMICONDUCTOR STRUCTURE

(71) Applicant: CHANGXIN MEMORY TECHNOLOGIES, INC., Hefei (CN)

(72) Inventors: Mengmeng Wang, Hefei (CN); Hsin-Pin Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 351 days.

(21) Appl. No.: 17/648,130

(22) Filed: Jan. 16, 2022

(65) Prior Publication Data
US 2022/0278054 A1 Sep. 1, 2022

Related U.S. Application Data

(63) Continuation of application No. PCT/CN2021/104791, filed on Jul. 6, 2021.

(30) Foreign Application Priority Data

Mar. 1, 2021 (CN) .......................... 202110224400.0

(51) Int. Cl.
*H01L 23/00* (2006.01)
*H01L 23/544* (2006.01)
*H01L 23/58* (2006.01)

(52) U.S. Cl.
CPC .......... *H01L 23/562* (2013.01); *H01L 23/544* (2013.01); *H01L 23/564* (2013.01); *H01L 23/585* (2013.01); *H01L 2223/5446* (2013.01)

(58) Field of Classification Search
CPC ... H01L 23/562; H01L 23/544; H01L 23/564; H01L 23/585; H01L 2223/5446; H01L 21/78; H01L 2924/3512
See application file for complete search history.

(56) References Cited

U.S. PATENT DOCUMENTS

| 7,223,673 | B2 | 5/2007 | Wang |
| 7,400,028 | B2 | 7/2008 | Tomita |
| 8,125,054 | B2 | 2/2012 | West |
| 8,587,089 | B2 | 11/2013 | Chiu |
| 8,987,923 | B2 | 3/2015 | Chou et al. |
| 2006/0012012 | A1 | 1/2006 | Wang |
| 2010/0078769 | A1 | 4/2010 | West |
| 2012/0104541 | A1 | 5/2012 | Chiu |
| 2012/0313217 | A1* | 12/2012 | Hung ............... H01L 23/585 257/532 |
| 2014/0035128 | A1 | 2/2014 | Chou et al. |
| 2017/0186732 | A1* | 6/2017 | Chu .................. H01L 24/24 |
| 2021/0210440 | A1* | 7/2021 | Manack .............. H01L 21/561 |

FOREIGN PATENT DOCUMENTS

| CN | 1734764 | A | 2/2006 |
| CN | 102468247 | A | 5/2012 |
| CN | 113035835 | A | 6/2021 |

* cited by examiner

*Primary Examiner* — Thanh T Nguyen
(74) *Attorney, Agent, or Firm* — Syncoda LLC; Feng Ma (57) ABSTRACT

A semiconductor structure includes a chip structure and a sealing structure disposed on a substrate of the semiconductor structure. The sealing structure includes a metal wall body and a blocking wall body located on a top of the metal wall body, and the metal wall body and the blocking wall body both are disposed around the chip structure.

10 Claims, 10 Drawing Sheets

SEMICONDUCTOR STRUCTURE AND MANUFACTURING METHOD OF SEMICONDUCTOR STRUCTURE

CROSS-REFERENCE TO RELATED APPLICATIONS

This application is a continuation of International Application No. PCT/CN2021/104791 filed on Jul. 6, 2021, which claims priority to Chinese patent Application No. 202110224400.0 filed to China Patent Office on Mar. 1, 2021. The disclosures of the above-referenced applications are hereby incorporated by reference in their entirety.

BACKGROUND

A chip manufactured on a wafer can be used in an electronic apparatus after being cut and packaged, cracks are easy to generate in the process of cutting the wafer, and the cracks easily extend to the inside of the chip which results in the failure of the chip.

SUMMARY

An embodiment of the present disclosure relates to the technical field of semiconductor manufacturing, and provides a semiconductor structure and a manufacturing method of the semiconductor structure.

In a first aspect, an embodiment of the present disclosure provides a semiconductor structure including a substrate, and a chip structure and a sealing structure located on the substrate. The sealing structure includes a metal wall body and a blocking wall body located on a top of the metal wall body. The metal wall body and the blocking wall body both are disposed around the chip structure.

In a second aspect, an embodiment of the present disclosure further provides a manufacturing method of the semiconductor structure, which includes the following operations.

A substrate is provided.

A chip structure and a sealing structure are formed on the substrate.

The sealing structure includes a metal wall body and a blocking wall body located on a top of the metal wall body.

The metal wall body and the blocking wall body both are disposed around the chip structure.

DETAILED DESCRIPTION

An embodiment of the present disclosure provides a semiconductor structure. By disposing a blocking wall body on a top end of a metal wall body, when cracks are generated during cutting a wafer, the blocking wall body can prevent the cracks in interlayer dielectric layers on the top of the metal wall body from extending towards a chip structure, thereby avoiding the failure of the chip structure.

Figure 1:
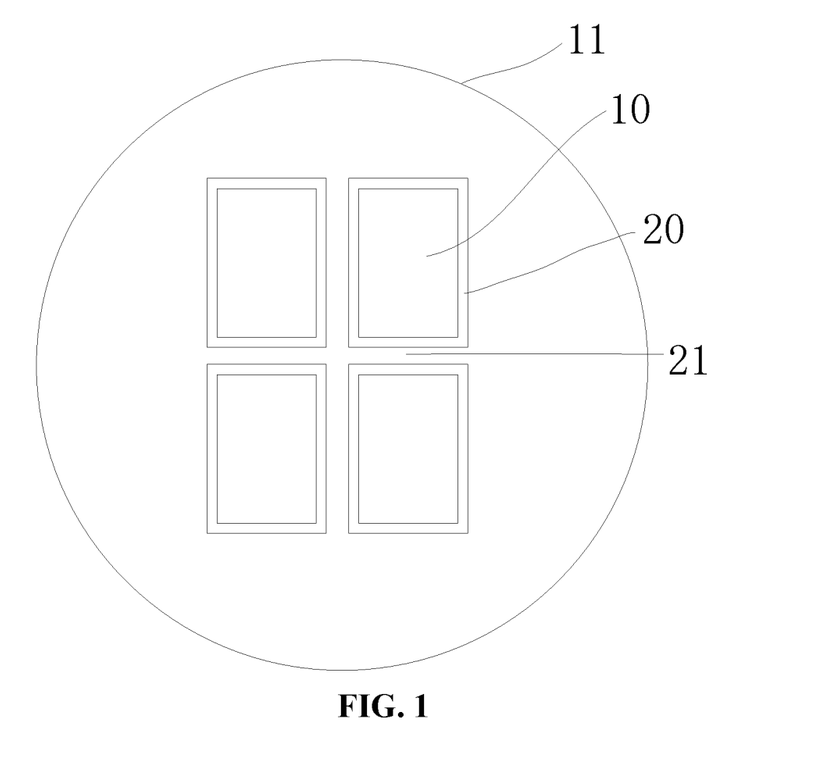
FIG. 1 is a top view of a semiconductor structure provided by an embodiment of the present disclosure.

Referring to FIG. 1, a semiconductor structure provided by the present embodiment includes a substrate 11, and chip structures 10 and sealing structures 20 located on the substrate 11. Exemplarily, the substrate 11 may include a silicon wafer, a germanium wafer, a gallium nitride wafer, a gallium germanide wafer, an SOI wafer and the like. The chip structures 10 are disposed on the substrate. The present embodiment does not limit the chip structures 10. Chip structures 10 corresponding to different types of chips may be different. For example, a chip structure 10 of a logic chip may include a device structure at a front section and a metal interconnection structure at a rear section. A chip structure 10 of a dynamic random access memory chip may include a device structure at a front section, a capacitance structure at a middle section and a metal interconnection structure at a rear section. Exemplarily, the device structure includes a planar transistor, an embedded gate transistor, a fin transistor, a surrounding gate transistor and the like. The sealing structure 20 is disposed around a periphery of the chip structure 10, and a cutting channel 21 is provided between the sealing structures 20.

Figure 2:
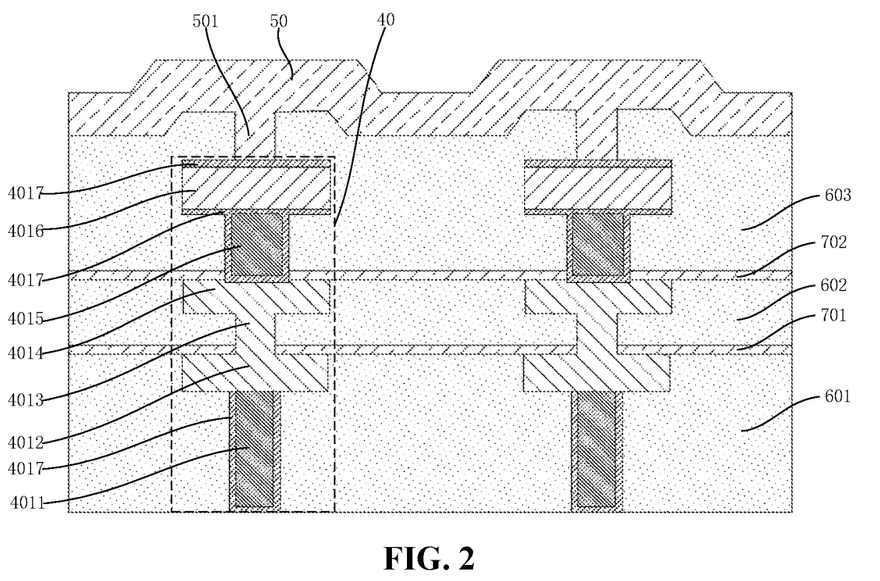
FIG. 2 is a first sectional view of the semiconductor structure provided by the embodiment of the present disclosure.

Referring to FIG. 1 and FIG. 2, FIG. 2 is a sectional view between the adjacent sealing structures 20. In the present embodiment, the sealing structure 20 includes a metal wall body 40 and a blocking wall body 501 located on a top of the metal wall body 40. The metal wall body 40 and the blocking wall body 501 both are disposed around the chip structure 10. Further, the semiconductor structure further includes an interlayer dielectric layer and an etching stop layer. The metal wall body 40 and the blocking wall body 501 are located in the interlayer dielectric layer and the etching stop layer. The interlayer dielectric layer, the etching stop layer and the metal wall body 40 can prevent external air, water vapor and the like from being in contact with the chip structure 10, so as to realize the protection on the chip structure 10.

The interlayer dielectric layer and the etching stop layer can be made of an insulation material. Exemplarily, a material of the interlayer dielectric layer may be silicon oxide. Certainly, it is not limited in the present embodiment. The material of the interlayer dielectric layer in the present embodiment may also be silicon oxynitride, silicon nitride and the like. A material of the metal wall body 40 may include copper, tungsten, aluminum and the like. The metal wall body 40 is not limited in the present embodiment. A material of the etching stop layer may be silicon oxynitride, silicon carbonitride and the like. It should be noted that the materials of the interlayer dielectric layer and the etching stop layer are different.

In some embodiments, the metal wall body 40 may include a plurality of sub wall bodies sequentially stacked in a direction perpendicular to the substrate, and projections of adjacent sub wall bodies on the substrate at least partially overlap. It is worth noting that each of the sub wall bodies is made of a metal material. The material of each of the sub wall bodies may be identical and may also be different, which is not limited in the present embodiment. Through such an arrangement, the metal wall body 40 is formed by stacking a plurality of sub wall bodies, and the manufacturing difficulty of the metal wall body 40 can be reduced. Additionally, the projections of adjacent sub wall bodies on the substrate at least partially overlap, so that the adjacent sub wall bodies are at least partially connected, improving the sealing effect.

Correspondingly, the interlayer dielectric layer includes a plurality of sub interlayer dielectric layers sequentially stacked in a direction perpendicular to the substrate. Each of the sub interlayer dielectric layers is at least disposed in the same layer as a sub wall body. During manufacturing, a sub interlayer dielectric layer may be firstly formed, and then, a notch is formed on the sub interlayer dielectric layer, and the sub wall body is formed in the notch. A sealing structure 20 is formed by repeating the above operation. Certainly, a metal layer may be firstly formed, a part of the metal layer is removed to form the sub wall body, and then, the sub interlayer dielectric layer disposed in the same layer as the sub wall body is formed. The sealing structure 20 may also be formed by repeating the above operation. Further, an etching stop layer is further disposed between the sub interlayer dielectric layers.

Further, each of the sub wall bodies is disposed in the same layer as a metal layer in the chip structure 10. In such a manner, the metal layer in the chip structure 10 and the sub wall body may be formed at the same time, which simplifies manufacturing operations of the semiconductor structure, and further reduces the manufacturing difficulty of the semiconductor structure.

In an implementation that each of the sub wall bodies is disposed in the same layer as a metal layer in the chip structure 10, the material of the sub interlayer dielectric layers forming the interlayer dielectric layer may be identical, partially identical or completely different, and the material of the sub wall bodies forming the metal wall body 40 may be identical, partially identical or completely different.

By taking FIG. 2 as an example, in some implementations, the metal wall body 40 may include 6 sub wall bodies sequentially stacked in a direction away from the substrate (not shown in the figure), the 6 sub wall bodies are respectively a first sub wall body 4011, a second sub wall body 4012, a third sub wall body 4013, a fourth sub wall body 4014, a fifth sub wall body 4015 and a sixth sub wall body 4016. The first sub wall body 4011 and the fifth sub wall body 4015 may be made of tungsten, the second sub wall body 4012, the third sub wall body 4013 and the fourth sub wall body 4014 may be made of copper, and the sixth sub wall body 4016 may be made of aluminum. Further, a blocking layer 4017 is disposed on side surfaces, perpendicular to the substrate, of the first sub wall body 4011 and the fifth sub wall body 4015 and the side surfaces, close to the substrate, of the first sub wall body 4011 and the fifth sub wall body 4015. Identically, the blocking layer 4017 is also disposed on two side surfaces, parallel to the substrate, of the sixth sub wall body 4016. Exemplarily, a material of the blocking layer 4017 may include titanium or titanium nitride. The interlayer dielectric layer may include a first sub interlayer dielectric layer 601, a second sub interlayer dielectric layer 602 and a third sub interlayer dielectric layer 603. The etching stop layer may include a first sub etching stop layer 701 and a second sub etching stop layer 702. The first sub etching stop layer 701 is located between the first sub interlayer dielectric layer 601 and the second sub interlayer dielectric layer 602. The second sub etching stop layer 702 is located between the second sub interlayer dielectric layer 602 and the third sub interlayer dielectric layer 603.

In the present embodiment, the metal wall body 40 is disposed in the interlayer dielectric layer. That is to say, when the interlayer dielectric layer covers the side walls, perpendicular to the substrate, of the metal wall body 40, at least a part of the interlayer dielectric layer also covers a top of the metal wall body 40 away from the substrate.

Figure 3:
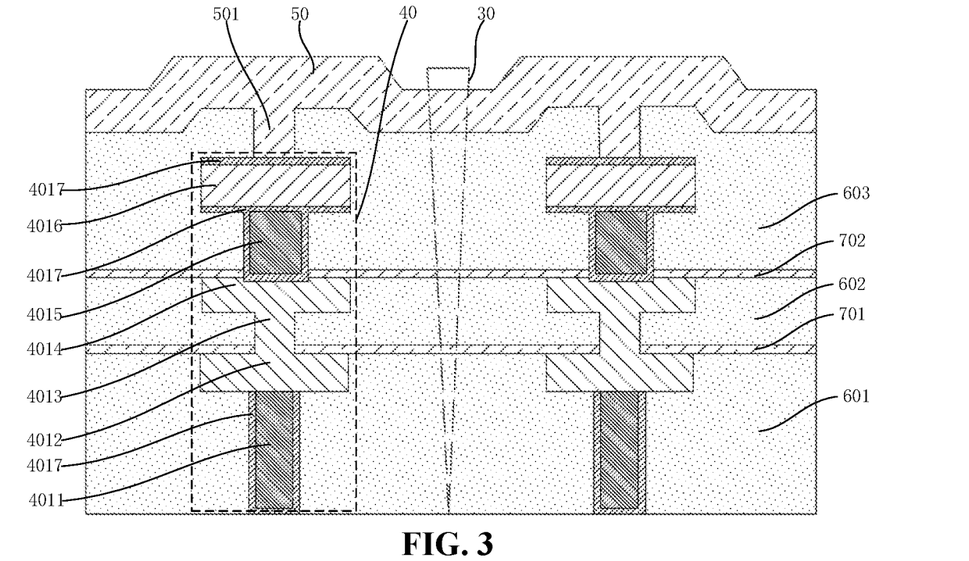
FIG. 3 is a second sectional view of the semiconductor structure provided by the embodiment of the present disclosure.

The blocking wall body 501 is disposed on the top of the metal wall body 40. Specifically, the blocking wall body 501 is located on a side, away from the substrate, of the metal wall body 40, and additionally, the blocking wall body 501 is disposed directly facing the top of the metal wall. As shown in FIG. 2 and FIG. 3, when a cutting seam 30 is formed on a cutting channel 21 during cutting a wafer, the blocking wall body 501 can prevent the cracks in the interlayer dielectric layer of a side, away from the substrate, of the metal wall body 40 from extending to the chip structure 10, thereby avoiding the failures of the chip structure 10.

Further, a bottom end, away from the substrate, of the blocking wall body 501 is in contact with the top end of at least a part of the metal wall body 40, so as to prevent a gap from generating between the blocking wall body 501 and the metal wall body 40 and prevent the cracks from extending to the chip structure 10 along the gap.

In some embodiments, the blocking wall body 501 may be located in the interlayer dielectric layer. That is to say, a thickness of the blocking wall body in a direction perpendicular to the substrate is smaller than a thickness of the interlayer dielectric layer on the top end of the metal wall body 40.

In other embodiments, the thickness of the blocking wall body 501 in a direction perpendicular to the substrate equals to the thickness of the interlayer dielectric layer on the top end of the metal wall body 40. During manufacturing, a blocking trench may be formed on a side surface, away from the substrate, of the interlayer dielectric layer, the blocking trench extends to the top end of the blocking wall body 501, additionally, a trench bottom of the blocking trench is in contact with the top end of the metal wall body 40, and the blocking trench is filled with the blocking wall body 501. Through such an arrangement, the cracks may be further prevented from extending to the chip structure 10 along the interlayer dielectric layer on a side, away from the substrate, of the metal wall body 40 when a cutting seam 30 is formed.

In the above implementation, the blocking wall body 501 is disposed on the top end of the metal wall body 40. Exemplarily, the blocking wall body 501 covers at least a part of a top surface of the metal wall body 40, so as to further prevent the cracks from extending to the chip structure 10 along a path between the blocking wall body 501 and the metal wall body 40 and to further improve the sealing effect on the chip structure 10.

By taking a structure as shown in FIG. 2 as an example, the sixth sub wall body 4016 of the metal wall body 40 is located on the top end of the metal wall body 40, a projection of the blocking wall body 501 on the substrate is located inside the projection of the sixth sub wall body 4016 on the substrate, so that the blocking wall body 501 covers a part of the sixth sub wall body 4016.

Referring to FIG. 1 and FIG. 3, in the present embodiment, during manufacturing, a plurality of chip structures 10 may be manufactured on the substrate (such as a silicon wafer), and a sealing structure 20 is formed on the periphery of each of the semiconductor structures. Then, the silicon wafer is cut, so as to form cutting seams 30 between the adjacent sealing structures 20 to obtain a plurality of separate chips.

According to the semiconductor structure provided by the present embodiment, a chip structure 10 and a the sealing structure 20 are disposed on the substrate, the sealing structure 20 includes a metal wall body 40 and a blocking wall body 501 located on the top of the metal wall body 40, and the metal wall body 40 and the blocking wall body 501 both are disposed around the chip structure 10. In a process of forming a cutting seam 30 through cutting a wafer, the blocking wall body 501 can prevent the cracks from extending to the chip structure 10 along the interlayer dielectric layer at one side, away from the substrate, of the metal wall body 40, and thereby avoiding the failure of the chip structure 10.

In some embodiments, the number of blocking wall body 501 may be multiple, and the multiple blocking wall bodies 501 are disposed at intervals around the chip structure 10. Additionally, the multiple blocking wall bodies 501 are all located on a top of the metal wall body 40. Through such an arrangement, the multiple blocking wall bodies 501 may provide multiplex protection to further improve the protection effect.

In some embodiments, the multiple blocking wall bodies 501 are all located on the top of the same metal wall body 40. For example, the multiple blocking wall bodies 501 are disposed on the top of the same sixth sub wall body 4016 at intervals, which reduces an area occupied by the sealing structures and improves the protection effect at the same time.

The semiconductor structure provided by the present embodiment further includes a sealing layer 50 disposed on a side of the sealing structure 20 away from the substrate. The sealing layer 50 covers the sealing structure 20, which further improves the protection effect and sealing effect on the chip structure 10. Exemplarily, the sealing layer 50 may be located on a side, away from the substrate, of the interlayer dielectric layer.

Further, the sealing layer 50 may be integral with the blocking wall body 501. Through such an arrangement, the blocking wall body 501 and the sealing layer 50 may be formed through the same manufacturing operation, and the manufacturing difficulty of the semiconductor structure is simplified.

Further, a top surface of a part of the sealing layer 50 on the blocking wall body 501 is higher than a top surface of a part of the sealing layer 50 on the cutting channel 21. Specifically, the sealing layer 50 on a structure between the blocking wall body 501 and the cutting channel 21 has a slope. Through such an arrangement, a lateral pressure on the sealing structure during cutting on the cutting channel can be buffered, and thus the stability of the sealing structure is improved.

A material of the blocking wall body 501 includes an insulation material. Exemplarily, the material of the blocking wall body 501 may include silicon nitride, silicon oxynitride and the like. In an implantation that the sealing layer 50 is integral with the blocking wall body 501, the material of the sealing layer 50 is the same as the material of the blocking wall body 501.

An embodiment of the present disclosure further provides a manufacturing method of a semiconductor structure. The manufacturing method is used for manufacturing the semiconductor structure in the embodiment above. A chip structure and a sealing structure are disposed on the substrate of the semiconductor structure. The sealing structure includes a metal wall body and a blocking wall body located on the top of the metal wall body. The metal wall body and the blocking wall body both are disposed around the chip structure. In the process of cutting a wafer, the blocking wall body can prevent the cracks from extending to the chip structure within the interlayer dielectric layer on a side, away from the substrate, of the metal wall body, and thereby avoiding the failure of the chip structure.

Figure 4:
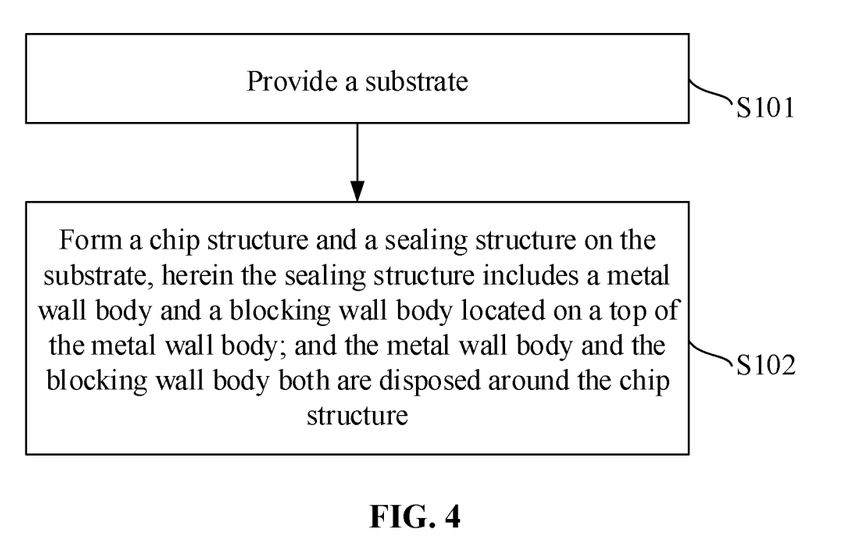
FIG. 4 is a flowchart of a manufacturing method of the semiconductor structure provided by an embodiment of the present disclosure.

Referring to FIG. 4, the embodiment of the present disclosure further provides a manufacturing method of the semiconductor structure, which includes the following operations.

At S101, a substrate is provided.

Exemplarily, the substrate may include a wafer made of semiconductor materials, such as a silicon wafer, a germanium wafer, a gallium nitride wafer, a gallium germanide wafer, a gallium arsenide wafer and an SOI wafer.

After the substrate is formed, the manufacturing method of a semiconductor structure provided by the present embodiment further includes the following operations.

At S102, a chip structure and a sealing structure are formed on the substrate, the sealing structure includes a metal wall body and a blocking wall body located on the top of the metal wall body. Herein, the metal wall body and the blocking wall body both are disposed around the chip structure.

Specifically, a plurality of chip structures may be disposed at intervals on the silicon wafer. The sealing structure is disposed on the periphery of each of the chip structures. The structure between the sealing structures on the periphery of the adjacent chip structures is a cutting channel. In the present embodiment, the blocking wall body is disposed on the top of the metal wall body, and the blocking wall body can prevent the cracks from extending to the chip structures along a side, away from the substrate, of the metal wall body during cutting the wafer, i.e., during the formation of a cutting seam in the cutting channel, and thereby avoiding the failure of the chip structures.

The present embodiment does not limit the chip structures. Chip structures 10 corresponding to different types of chips may be different. For example, a chip structure 10 of a logic chip may include a device structure at a front section and a metal interconnection structure at a rear section. A chip structure 10 of a dynamic random access memory chip may include a device structure at a front section, a capacitance structure at a middle section and a metal interconnection structure at a rear section. Exemplarily, the device structure includes a planar transistor, an embedded gate transistor, a fin transistor, a surrounding gate transistor and the like.

In the present embodiment, the operation of forming the chip structure and the sealing structure on the substrate includes the following details.

Figure 5:
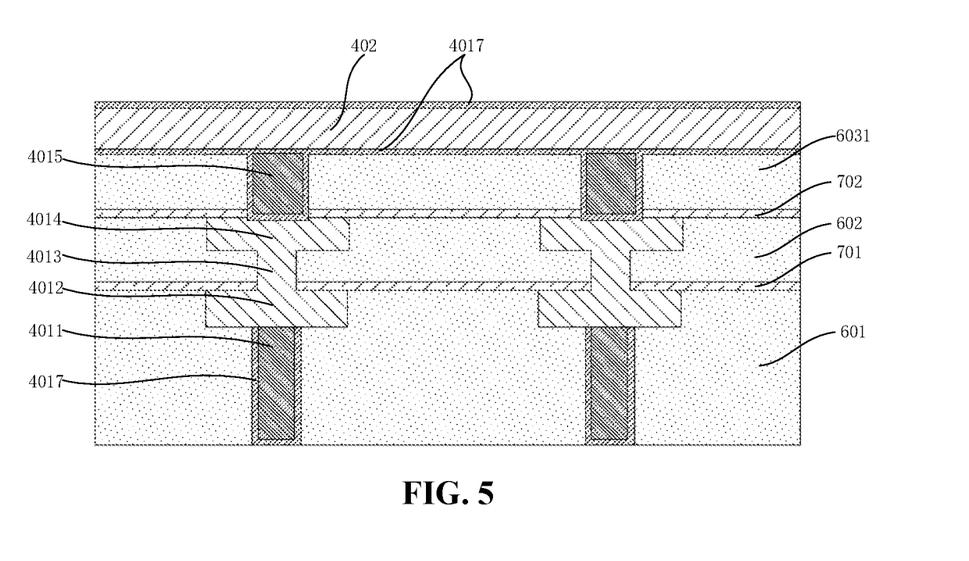
FIG. 5 is a schematic structural diagram of a structure after a top-layer metal layer is formed in the manufacturing method of the semiconductor structure provided by an embodiment of the present disclosure.

As shown in FIG. 5, a plurality of sub interlayer dielectric layers, a plurality of sub wall bodies and a top-layer metal layer 402 are formed on the substrate (not shown in the figure). Specifically, a first sub interlayer dielectric layer 601, a second sub interlayer dielectric layer 602 and a top-layer dielectric layer 6031 are sequentially formed on the substrate. The first sub wall body 4011 and the second sub wall body 4012 are located in the first sub interlayer dielectric layer 601. The third sub wall body 4013 and the fourth sub wall body 4014 are located in the second sub interlayer dielectric layer 602, the fifth sub wall body 4015 is located in the top-layer dielectric layer 6031, the top-layer metal layer 402 is located on the top-layer dielectric layer 6031, and the top-layer metal layer 402 is connected with the sub wall body, and specifically, the top-layer metal layer 402 is connected with the fifth sub wall body 4015. When the sub wall body is formed, the chip structure (not shown in the figure) can be formed at the same time. The sub wall body is located on the outer side of the chip structure, and is disposed around the chip structure. Specifically, the chip structure and the sub wall body may be formed at the same time in the same process operations such as deposition, photo-etching and etching.

Further, the method further includes forming an etching stop layer. The etching stop layer may include a first sub etching stop layer 701 and a second sub etching stop layer 702. The first sub etching stop layer 701 is located between the first sub interlayer dielectric layer 601 and the second sub interlayer dielectric layer 602, and the second sub etching stop layer 702 is located between the second sub interlayer dielectric layer 602 and the top-layer dielectric layer 6031.

Figure 6:
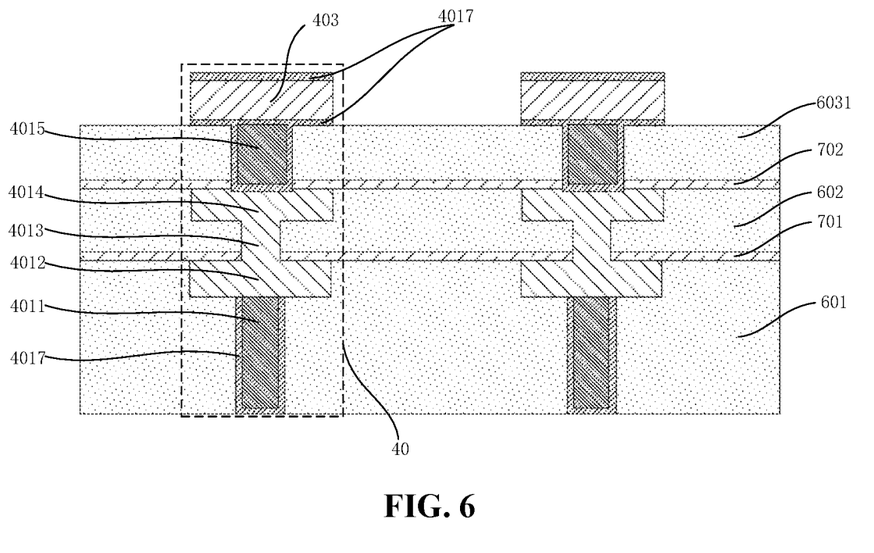
FIG. 6 is a schematic structural diagram of a structure after a metal block is formed in the manufacturing method of the semiconductor structure provided by the embodiment of the present disclosure.

As shown in FIG. 6, after the top-layer metal layer 402 is formed, the method further includes removing a part of the top-layer metal layer 402 to form a metal block 403 connected with both the sub wall body and the top-layer dielectric layer. Exemplarily, a part of the top-layer metal layer 402 may be removed in modes of photo-etching, etching and the like. Specifically, the metal block 403 may also be used as a sub wall body and is disposed around the chip structure.

Figure 7:
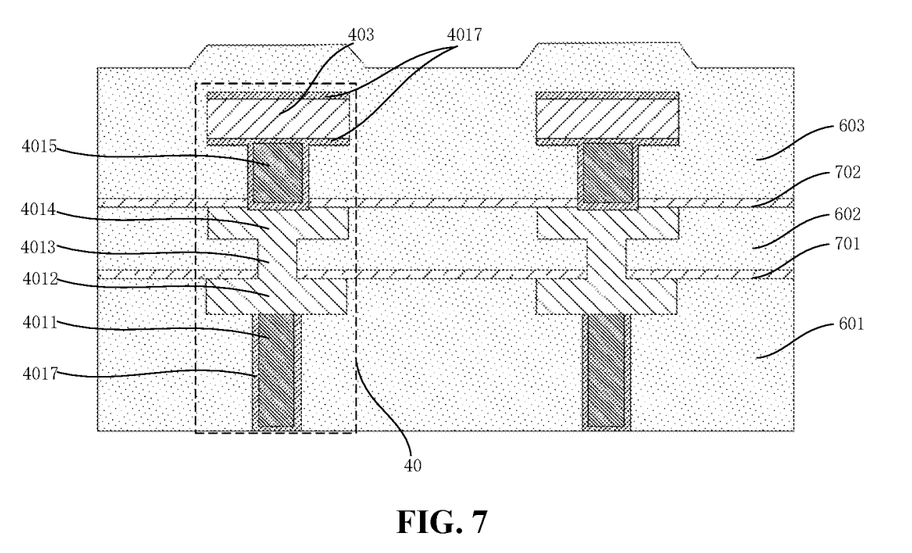
FIG. 7 is a schematic structural diagram of a structure after a covering layer is formed in the manufacturing method of the semiconductor structure provided by the embodiment of the present disclosure.
Figure 8:
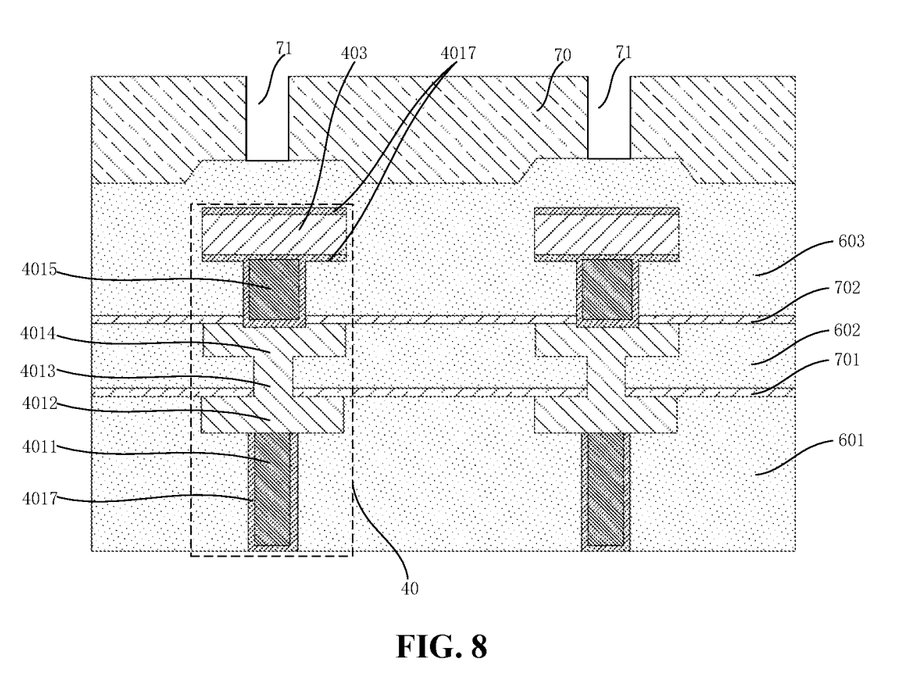
FIG. 8 is a schematic structural diagram of a structure after a photoresist layer is formed in the manufacturing method of the semiconductor structure provided by the embodiment of the present disclosure.

As shown in FIG. 7, after the metal block 403 is formed, the method further includes forming a covering layer on the metal block 403. A material of the covering layer may be identical to the material of the top-layer dielectric layer, so as to achieve a better combination effect. Therefore, during cutting a wafer, peeling does not easily occur. The material of the covering layer and the top-layer dielectric layer is silicon oxide. The covering layer and the top-layer dielectric layer jointly form the third sub interlayer dielectric layer 603, and the third sub interlayer dielectric layer 603 covers the metal block 403. As shown in FIG. 8, after the covering layer is formed, a photoresist layer 70 with an opening 71 is formed on the covering layer, and the opening 71 is located on the sub wall bodies.

Figure 9:
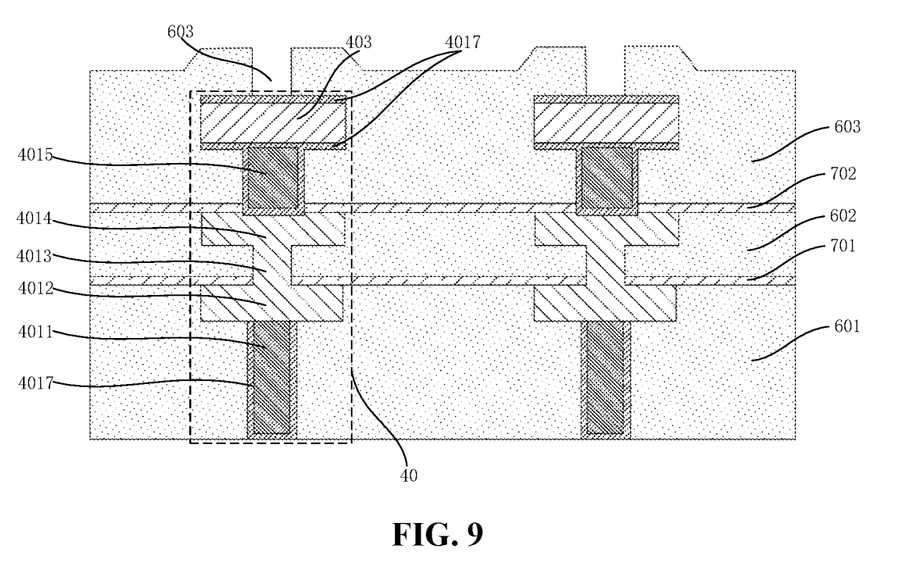
FIG. 9 is a schematic structural diagram of a structure after a blocking trench is formed in the manufacturing method of the semiconductor structure provided by the embodiment of the present disclosure.
Figure 10:
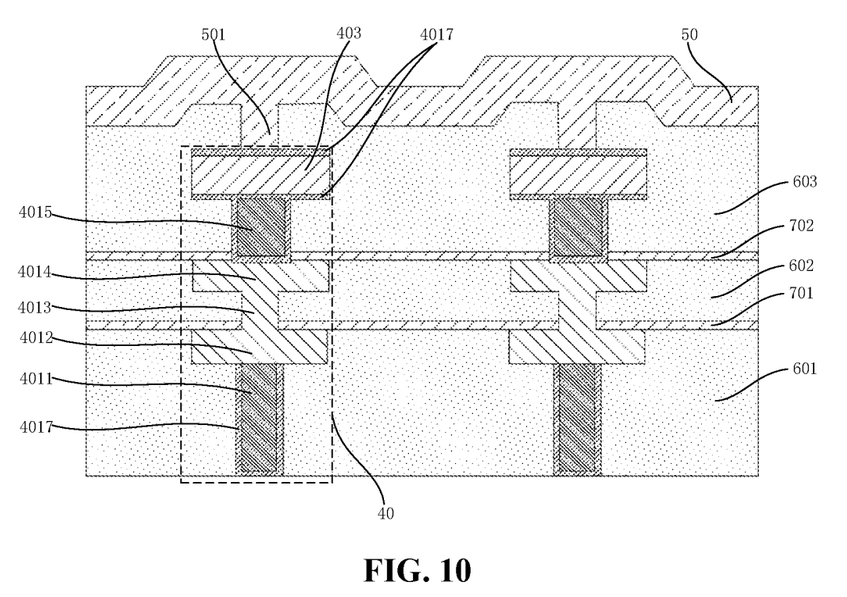
FIG. 10 is a schematic structural diagram of a structure after a blocking wall body is formed in the manufacturing method of the semiconductor structure provided by the embodiment of the present disclosure.

As shown in FIG. 9, after the photoresist layer is formed, the covering layer is etched by taking the photoresist layer as a mask so as to form a blocking trench 603 exposing the metal block 403. As shown in FIG. 10, the blocking trench 603 is filled with a blocking material to form the blocking wall body 501.

In the above implementation, the metal block 403 may be used as a sub wall body. The metal block 403 and other sub wall bodies together form a metal wall body 40.

Through such an arrangement, a blocking trench 603 is formed in an etching manner, and then, the blocking wall body 501 is formed in the blocking trench 603, which improves the position and dimension precision of the blocking wall body 501. Additionally, the blocking trench 603 extends to a corresponding metal block 403 from a top surface, away from the substrate, of the covering layer to further expose the corresponding metal block 403. When the blocking wall body 501 is formed, the blocking wall body 501 is in contact with the metal block 403, and the cracks can be prevented from extending to the chip structure along a path between the blocking wall body 501 and the metal wall body 40.

Exemplarily, a material of the sub wall body and the metal block 403 may include copper, tungsten, aluminum and the like. The metal wall body 40 is not limited in the present embodiment.

The number of the sub wall body may be multiple, the multiple sub wall bodies are stacked, each of the sub wall bodies is disposed in the same layer as a metal layer in the chip structure, and the manufacturing difficulty of the semiconductor structure can be simplified. It is worth noting that the projections of adjacent sub wall bodies on the substrate at least partially overlap so as to avoid the formation of a gap between the adjacent sub wall bodies.

By taking FIG. 10 as an example, the plurality of sub wall bodies may include a first sub wall body 4011, a second sub wall body 4012, a third sub wall body 4013, a fourth sub wall body 4014 and a fifth sub wall body 4015 sequentially disposed in a direction away from the substrate (not shown in the figure). The first sub wall body 4011 and the fifth sub wall body 4015 may be made of tungsten, the second sub wall body 4012, the third sub wall body 4013 and the fourth sub wall body 4014 may be made of copper, and the metal block 403 may be made of aluminum. Further, a blocking layer 4017 is disposed on the side surfaces, perpendicular to the substrate, of the first sub wall body 4011 and the fifth sub wall body 4015, and the side surfaces close to the substrate, of the first sub wall body 4011 and the fifth sub wall body 4015. Identically, the blocking layer 4017 is also disposed on two side surfaces, parallel to the substrate, of the metal block 403. Exemplarily, a material of the blocking layer 4017 may include titanium or titanium nitride.

Continuously referring to FIG. 10, the operation of manufacturing the blocking wall body 501 of the manufacturing method of a semiconductor structure provided by the present embodiment includes forming a sealing material on the covering layer, filling the blocking trench 603 with a part of the sealing material so as to form the blocking wall body 501, and covering the covering layer with a part of the sealing material to form the sealing layer 50.

Through such an arrangement, the sealing layer 50 is integral with the blocking wall body 501. By forming the blocking wall body 501 and the sealing layer 50 in the same manufacturing operation, the manufacturing difficulty of the semiconductor structure is simplified, and at the same time, the sealing effect is improved.

Exemplarily, the sealing layer 50 may be a silicon nitride layer. Correspondingly, the blocking wall body 501 may also be made of silicon nitride.

Further, a top surface of a part of the sealing layer 50 on the blocking wall body 501 is higher than a top surface of a part of the sealing layer 50 on the cutting channel 21. Specifically, the sealing layer 50 on a structure between the blocking wall body 501 and the cutting channel 21 has a slope. Through such an arrangement, a lateral pressure on the sealing structure during cutting on the cutting channel 21 can be buffered, and the thus stability of the sealing structure is improved.

According to the semiconductor structure manufactured by the manufacturing method of a semiconductor structure provided by the present embodiment, a chip structure and a sealing structure are disposed on the substrate, the sealing structure includes a metal wall body 40 and a blocking wall body 501 located on the top of the metal wall body 40, and the metal wall body 40 and the blocking wall body 501 both are disposed around the chip structure 10. In a process of forming the cutting seam through cutting a wafer, the blocking wall body 501 can prevent the cracks from extending to the chip structure along the interlayer dielectric layer on a side, away from the substrate, of the metal wall body 40, and therefore avoiding the failure of the chip structure.

The above descriptions are only specific embodiments of the present disclosure, but the protection scope of the present disclosure is not limited thereto, and any changes or substitutions that can be easily made by a person skilled in the art within the technical scope disclosed in the present disclosure shall fall within the protection scope of the present disclosure. Therefore, the protection scope of the present disclosure shall be determined by the protection scope of the claims.

What is claimed is:

1. A semiconductor structure, comprising:
    a substrate;
    a chip structure and a sealing structure located on the substrate, wherein
    the sealing structure comprises a metal wall body and a blocking wall body located on a top of the metal wall body; and
    the metal wall body and the blocking wall body both are disposed around the chip structure;
    a sealing layer, located on a side of the sealing structure away from the substrate; and
    an interlayer dielectric layer and an etching stop layer, wherein the metal wall body and the blocking wall body are located in the interlayer dielectric layer and the etching stop layer, and the sealing layer covers the top surface of the interlayer dielectric layer.

2. The semiconductor structure of claim 1, wherein a plurality of blocking wall bodies are disposed at intervals around the chip structure.

3. The semiconductor structure of claim 2, wherein the plurality of blocking wall bodies are all located on the top of the metal wall body.

4. The semiconductor structure of claim 1, wherein the blocking wall body is integral with the sealing layer.

5. The semiconductor structure of claim 4, wherein a material of the blocking wall body comprises an insulation material.

6. The semiconductor structure of claim 5, further comprising:
    a scribe line located between the sealing structures, wherein a top surface of a part of the sealing layer on the blocking wall body is higher than a top surface of a part of the sealing layer on the scribe line.

7. The semiconductor structure of claim 5, wherein the material of the blocking wall body and a material of the sealing layer both include silicon nitride.

8. The semiconductor structure of claim 1, wherein the blocking wall body covers a part of a top surface of the metal wall body.

9. The semiconductor structure of claim 1, wherein the metal wall body comprises a plurality of sub wall bodies sequentially stacked in a direction perpendicular to the substrate, and projections of adjacent sub wall bodies of the plurality of sub wall bodies on the substrate at least partially overlap.

10. The semiconductor structure of claim 9, wherein each of the sub wall bodies is disposed in the same layer as a metal layer in the chip structure.

* * * * *